United States Patent [19]

Brown

[11] Patent Number: 4,616,406

[45] Date of Patent: Oct. 14, 1986

[54] PROCESS OF MAKING A SEMICONDUCTOR DEVICE HAVING PARALLEL LEADS DIRECTLY CONNECTED PERPENDICULAR TO INTEGRATED CIRCUIT LAYERS THEREIN

[75] Inventor: Candice H. Brown, San Jose, Calif.

[73] Assignee: Advanced Micro Devices, Inc., Sunnyvale, Calif.

[21] Appl. No.: 655,476

[22] Filed: Sep. 27, 1984

[51] Int. Cl.[4] .................... H01L 23/02; H01L 23/48; H01L 23/28

[52] U.S. Cl. .......................................... 29/588; 29/589; 29/590; 29/591; 357/68; 357/72; 357/74; 174/52 PE

[58] Field of Search ................. 29/589, 590, 591, 588; 174/52 PE; 357/68, 72, 74

[56] References Cited

U.S. PATENT DOCUMENTS

| | | | |
|---|---|---|---|
| 3,273,029 | 9/1966 | Ross | 357/68 X |
| 4,074,342 | 2/1978 | Honn et al. | 357/68 X |
| 4,196,444 | 4/1980 | Butner et al. | 357/68 X |
| 4,312,116 | 1/1982 | Moser et al. | 29/588 |
| 4,407,007 | 9/1983 | Desai et al. | 357/68 X |
| 4,451,842 | 5/1984 | Pommerrenig | 357/68 X |

OTHER PUBLICATIONS

Blodgett, Jr., A. J., "Microelectronic Packaging" in *Scientific American*, vol. 249 No. 1, Jul. 1983, pp. 86-96.

Primary Examiner—Brian E. Hearn
Assistant Examiner—John T. Callahan
Attorney, Agent, or Firm—Patrick T. King; John P. Taylor; Eugene H. Valet

[57] ABSTRACT

An improved package for a semiconductor device comprises an integrated circuit die and a mounting package having an array of parallel leads which directly connect perpendicular to the die. The process for making the package comprises forming an array of parallel, spaced apart, conductor pins; bonding the array of parallel conductor pins directly to an integrated circuit die while maintaining the die in a plane perpendicular to the parallel pins; and surrounding the die with a package material capable of protecting the die.

12 Claims, 9 Drawing Figures

PROCESS OF MAKING A SEMICONDUCTOR DEVICE HAVING PARALLEL LEADS DIRECTLY CONNECTED PERPENDICULAR TO INTEGRATED CIRCUIT LAYERS THEREIN

BACKGROUND OF THE INVENTION

1. Field of the Invention

This invention relates to packaging of semiconductor devices. More particularly, this invention relates to a semiconductor device having an array of parallel leads directly bonded to the integrated circuit die perpendicular to the die layers.

2. Background Art

Typical prior art lead packages for semiconductor devices, such as integrated circuit dies, comprise the so-called dual in-line type packages wherein the die is bonded face up to a mounting pad and peripheral leads, located parallel to the plane of the die and mounting pad, are connected to contact pads, such as shown in Denlinger et al U.S. Pat. No. 4,173,768, on opposite edges on the die. The device is then encapsulated in plastic and the lead ends are bent perpendicular to the device. Duffek et al U.S. Pat. No. 3,947,867 illustrates such devices.

Such lead packages may include the provision of leads on all four edges of the die when further lead connections are needed. Typical lead packages of this sort are illustrated in Hayakawa et al U.S. Pat. No. 4,280,132; Burns U.S. Pat. No. 4,330,790; Brown U.S. Pat. No. 4,400,714; Grabbe U.S. Pat. No. 4,408,218; and Chiba et al U.S. Pat. No. 4,415,917.

Variations of this type of lead connection do exist, such as shown in Shen et al U.S. Pat. No. 4,236,171, where wires are bonded directly to pads of a power transistor, and Anazawa et al U.S. Pat. No. 4,340,901 wherein the end of the lead is bend at a right angle to permit it to be fastened perpendicular to the die to provide a stronger mechanical bond between the die and the lead.

Another packaging technique involves the so-called "flip chip" approach wherein the die is bonded face down to an insulative substrate as shown in Hantusch U.S. Pat. No. 4,288,808 and Test U.S. Pat. No. 4,423,435. This approach has been described, in connection with the use of spring loaded cooling pistons applied to the backside of the die, by Blodgett in "Microelectronic Packaging" in volume 249 of Scientific American (July, 1983) at pages 86-89. In this article the author describes a package termed a module which may have as many as 100 to 133 high speed chips bonded by the "flip chip" method to a substrate comprising 33 conductive layers which, together with a grid of vias, interconnect the dies together. A grid of pins or leads is brazed perpendicular to the opposite surface of the substrate to provide interconnection of the module to other electrical devices.

However, regardless of the type of prior art method used to provide electrical connection to the die, as more functions are integrated on one chip, the number of pin connections or "pin-out" increases. At the same time, the area required by each device or gate on a chip decreases. Thus, the industry is approaching a point where further reduction of die size will be limited not by lithography constraints but rather by the number of wire bond pads which can be placed around the perimeter of the die. Unfortunately, reducing the bond pitch or spacing reduces assembly yields. Furthermore, the increasing demand for switching speed is not compatible with the present packaging practices for lead placement where a signal must be routed to the perimeter of a die, through a wire bond pad to a lead finger, and then out of the package and down the lead to a circuit trace on a PC board.

These considerations have led to an increasing need to provide better packaging in the form of more leads to the die without, however, overcrowding the lead spacing.

SUMMARY OF THE INVENTION

It is therefore an object of this invention to provide an improved semiconductor package comprising an integrated circuit die and a mounting package including leads and a method of making same.

It is another object of this invention to provide an improved semiconductor package comprising an integrated circuit die and a mounting package which includes an array of leads mounted perpendicular to the plane of the die.

It is yet another object of this invention to provide and improved semiconductor package comprising an integrated circuit die and a mounting package which includes an array of leads mounted perpendicular to the plane of the die and bonded directly to the die.

It is a further object of the invention to provide a densely packed array of leads on a semiconductor package.

These and other objects of the invention will be apparent from the description and accompanying drawings.

In accordance with the invention, an improved semiconductor device comprises an integrated circuit die having directly mounted to contacts thereon an orthogonal array of parallel leads perpendicular to the die. The die and leads are mounted in a package material to protect the die as well as to assist in maintaining the alignment of the array of leads. In a preferred embodiment, the array of parallel leads is arranged in a hexagonal spacing rather than orthogonal to provide a higher lead density.

DESCRIPTION OF THE PREFERRED EMBODIMENTS

Figure 1:
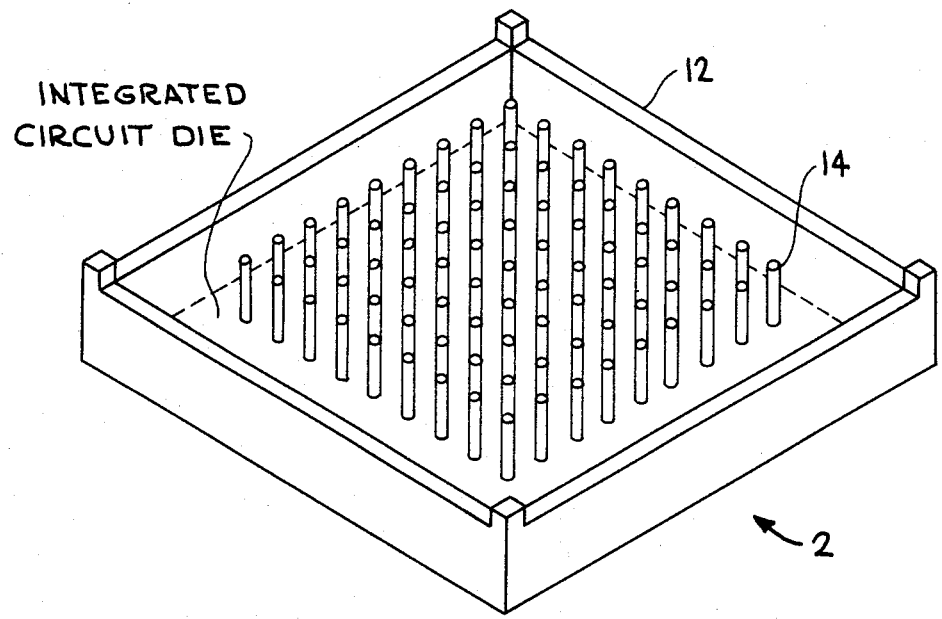
FIG. 1 is an isometric view of one embodiment of the semiconductor package of the invention.

Referring now to FIG. 1, the improved semiconductor package of the invention is generally illustrated at 2.

The package comprises an array of parallel, equally spaced apart, leads 14 which are bonded directly, and perpendicularly, to the integrated circuit die (not shown) within packaging material 12.

The advantages of the package construction of the invention, from an assembly standpoint, include high density spacing of leads for maximizing of board space utilization; ease of assembly of the finished package on the PC board using present chip carrier pick and place tooling to handle the assembly; and the assembly of leads and dies for different lead counts using the same tools—resulting in lower tooling costs, i.e., no lead frame tooling for every lead count.

From an electrical standpoint, the advantages of the package of the invention include shorter traces on the PC board resulting in less loading of signals, faster switching, etc.; lower circuit board costs per function; lower lead inductance and capacitance; and good match of electrical parameters between pins or leads because of their uniform lengths.

The package of the invention also possesses improved thermal characteristics with good thermal conductivity through the leads to the PC board and no thermal coefficient of expansion mismatch problems.

As referred to above, one of the characteristics of the invention is the improved lead density. For example, in the arrangement shown in FIG. 1, a 289 lead count surface mountable package would only require 0.3 square inches with the leads mounted on 25 mil centers while an equivalent prior art plastic leaded chip carrier having 25 mil center lead spacing would require 3.5 square inches, and a standard 50 mil center plastic leaded chip carrier would require 13.0 square inches. Package 2, as illustrated in FIG. 1 after molding in plastic, would, in contrast, have exterior dimensions of only 0.55"×0.55"×0.1". As will be discussed below, even higher density of leads spacing is possible using one embodiment of the invention.

The package of the invention is also characterized by improved heat dissipation. The heat dissipation for the package can be calculated as:

Heat dissipation/lead count = $1/K \times L/A$ wherein:
$K(Cu) = 0.00998$ W/mil/°C.
$A$ = Area of 30 gauge wire = 79.01 mil
$L$ = Length of lead = 60 mil Assuming all heat will go through the lead, for a 168 lead count package, the heat dissipation would equal 0.45299. If the device dissipates 10 watts, then the junctions would be 4.5° C. higher than the traces to which they are connected. This heat would be transferred to the copper traces on the PC board. Depending on the thickness of the laminates and the copper traces, the heat dissipation will vary. The best interconnect substrate would be an aluminum backed flex circuit. The heat would then go through perhaps 25 mils of polymer to an aluminum heat sink.

Figure 2:
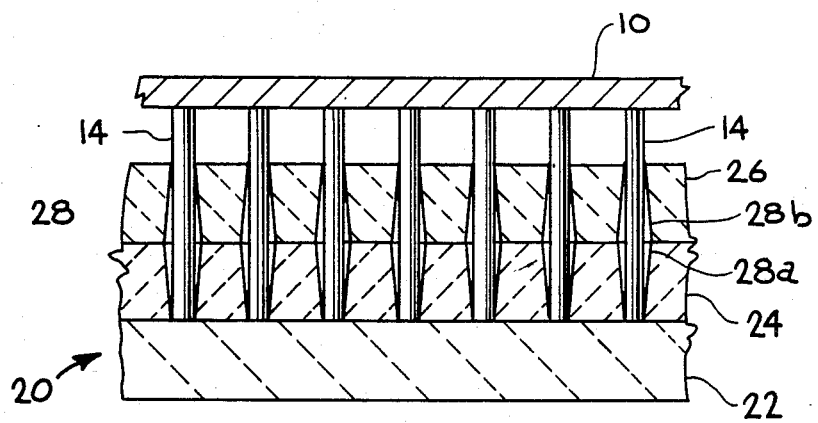
FIG. 2 is a side section view of a jig used in forming the array of leads.

A workholder or jig 20, which may be used in forming package 2, is shown in FIG. 2. Package 2 may be constructed by first placing the leads 14 into a grid workholder or jig 20 which will hold the array of leads in a parallel, equally spaced apart, arrangement with all the leads of even height for subsequent attachment thereto of the die.

In the illustrated embodiment of FIG. 2, workholder or jig 20 is comprised of a three layered laminated device comprising ceramic layers 22, 24, and 26. Layers 24 and 26 are drilled precisely with a laser to provide, in each layer, a precise array of parallel, equally spaced apart, bores. In the preferred embodiment, eleven mil diameter holes are drilled on a spacing of 25 mils apart. When a ceramic substrate is drilled in this way, a conical rather than perfectly cylindrical hole results as seen in FIG. 2. Ceramic substrate layers 24 and 26 are preferably about 25 mils thick and, after drilling, are stacked back to back with the wider ends of the respective holes or bores 28a and 28b facing each other. Undrilled ceramic layer or substrate 22 is then attached to one side and the three layers or substrates are laminated together with adhesive to form the completed workholder or jig 20.

The conical shape of the bore or hole drilled in each of the ceramic layers plus the bonding together of the two substrates to place the wider portions of the bores 28a and 28b in the middle of bore 28 permits jig or workholder 20 to hold each of the leads precisely perpendicular without providing undue friction or drag on the lead when the array of leads are subsequently removed from the jig or workholder after the lead array has been bonded together to form a unit as will be described below.

To form the lead array using workholder 20, each lead is placed in a hole or bore 28 in workholder 20 and cut off with a laser precisely 10 mils above the surface of workholder 20. The leads may be formed by winding off 10 mil diameter copper wire from a spool while the workholder is sitting on XY table so that it may be indexed to the next array location to permit the accurate, yet automatic, filling of workholder 20 with leads 14.

After all of the holes or bores 28 in workholder 20 have been filled with leads 14, die 10 may be attached to the array by placing it face down on the wires. Die 10 is preferably provided with a grid array top metallization layer similar to a "flip chip" or "bump chip" with high temperature solder at each of the contact pads in registry with the lead array in advance of the connection. Alternatively, the array of leads may be presoldered using a roller carrying high temperature solder paste that is passed over the tips of the leads while they are held in grid workholder 20. Die 10 is then placed or positioned on the array of leads by precisely aligning the edges of workholder 20 with the edges of die 10, and the solder is reflowed to attach the leads to the die with hot nitrogen or forming gas to melt the high temperature solder.

Figure 3:
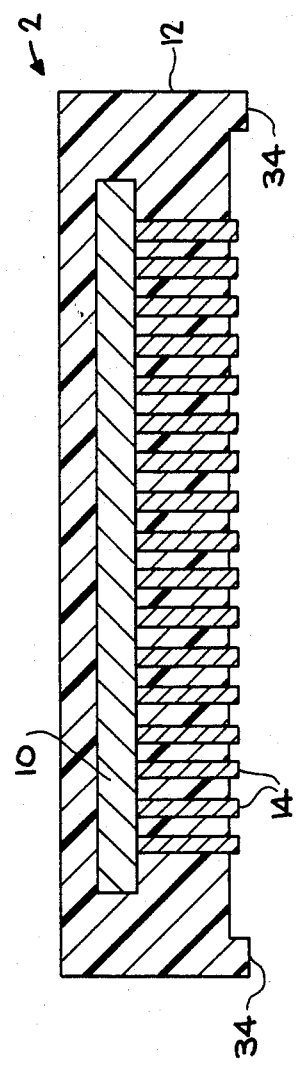
FIG. 3 is a side section view of one embodiment of the invention.

The assembly is then removed from workholder 20, placed into a mold, and plastic is poured around the die and the array of leads attached thereto to form package 2 shown in FIG. 3. After molding, the flash is removed by mild abrasion on the bottom of the leads. Since there is no lead trim and form operation, however, the cost is reduced and the reliability is improved since lead trim and form creates cracks along the plastic/lead frame interface. The resulting package 2 comprises plastic material 12 surrounding die 10 and leads 14.

Package 2 is also provided with standoffs 34 which protrude approximately 15 mils from the bottom of package 2. Standoffs 34, which may be located on the four corners of package 2, have a predetermined cross-section which will, in turn, lock into a mating pattern on a copper trace of the PC board to which package 2 will be ultimately attached. This will assure good alignment between leads 14 and the contact pads on the PC board. The traces on a PC board usually sit 3 mils higher than the base laminate leaving a 2 mil gap which would be taken up by reflow solder. Standoffs 34 may be all of the same cross-section or they may have different cross-sections to assure that package 2 may only be mounted or oriented in one way on the PC board to prevent improper connection of package 2 to the PC board.

To provide an array of metal bonding pads on a conventional chip to permit the perpendicular bonding thereto of the array of parallel leads in accordance with the invention, additional conducting layers may be placed on the die. The die could be first patterned with a polymer dielectric, such as a polyimide, and metal traces to bring the signals from existing bond pads on the perimeter of the die to the respective lead array sites. Another dielectric layer would then be added with vias and then the final lead attach pad metallized on top. While some of the electrical and thermal advantages of the invention, such as shorter lead length, etc., would not be realized in this construction, it would permit the interim use of conventional dies without complete redesign of the die layout. New die layouts would, of course, be designed to take maximum advantage of the direct lead connection possible in the practice of this invention.

Figure 4:
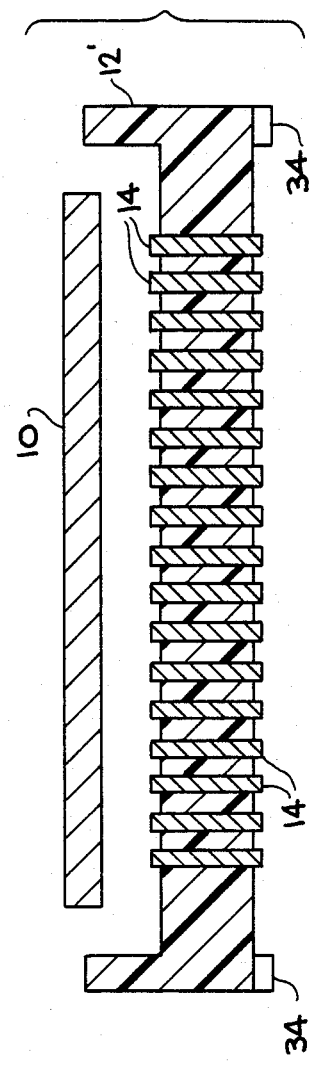
FIG. 4 is a side section exploded view illustrating an alternate method of construction.

In FIG. 4, an alternate embodiment is shown in which the array of leads is first surrounded by packaging material 12' prior to attachment of die 10 thereto. A premolded carrier may be back filled with epoxy. For hermetic sealing, the premolded carrier could be made of metal with glass insulation around each lead going through a drilled hole. In either case, after attachment of die 10 to leads 14, the package may be completed using conventional techniques for either hermetic or nonhermetic packaging as is well known to those skilled in the art.

Figure 7:
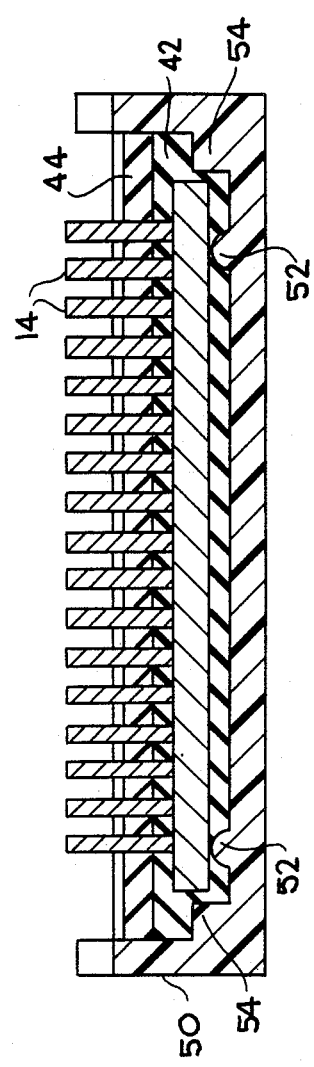
FIG. 7 is a side section view of a semiconductor package made in accordance with the invention utilizing the potting shell shown in FIGS. 5 and 6.
Figure 5:
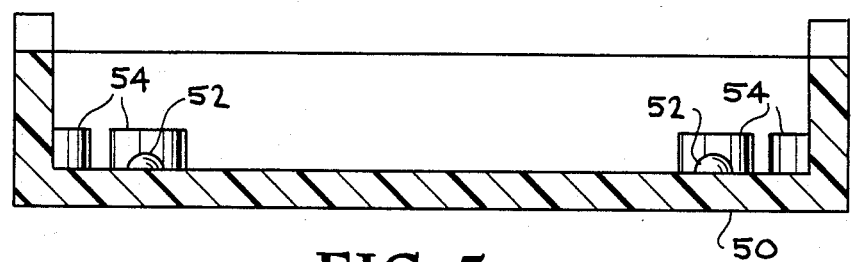
FIG. 5 is a side section view of a potting shell utilized in the invention.
Figure 6:
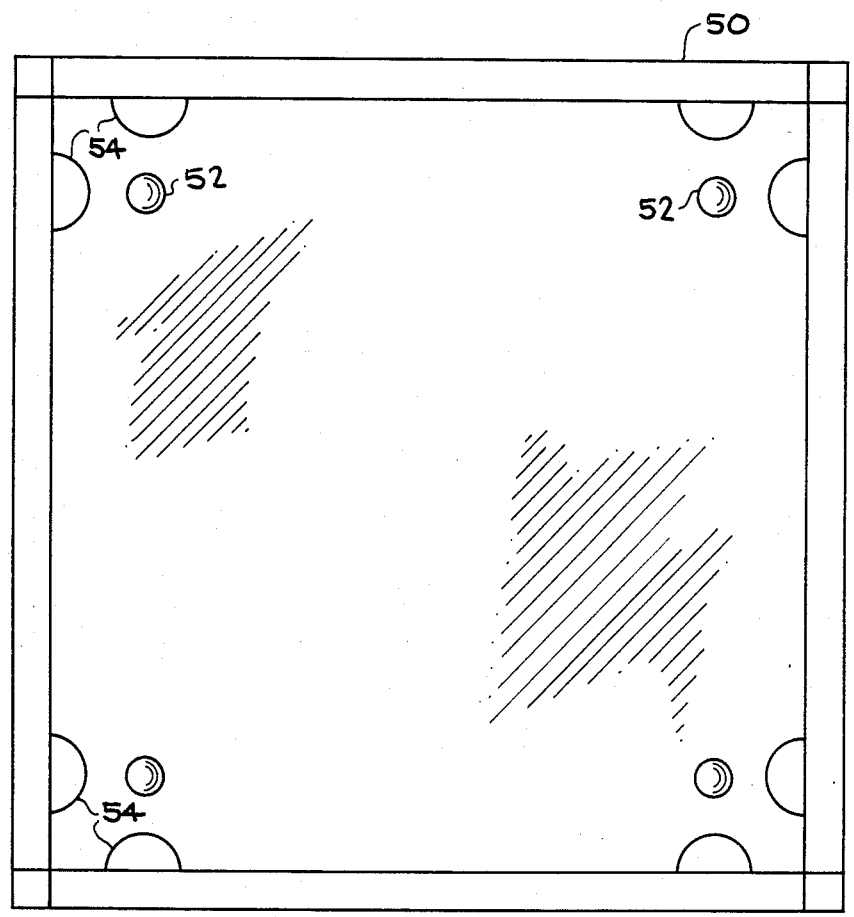
FIG. 6 is a top view of the potting shell of FIG. 5.

Referring now to FIGS. 5–7, a preferred embodiment is shown in which the partially assembled package having the die 10 attached to leads 14 is placed in a potting shell 50. Standoff hemispherical bumps or spacers 52 are provided on the inside of the bottom wall of potting shell 50 to space die 10 from the bottom of potting shell 50 for a purpose to be described below. Hemicylindrical guides 54 are located on the side walls of potting shell 50 to assure proper positioning of die 10.

Potting shell 50 may then be partially filled with an elastomeric silicon die gel 42. Die 10 is then placed in potting shell 50 positioned therein from the bottom and sidewalls, respectively, by hemispherical standoffs 52 and hemicylindrical guides 54. Potting shell 50 is then partially backfilled with more gel, cured, and then topped off with a potting solution 44. This, then, permits die 10 in potting shell 50 to be "floating" in a low stress situation. This type of arrangement allows outside dimensions of the potting shells to be standardized with different size guides and standoffs within the potting shell to permit the use of different size dies therein.

Figure 8:
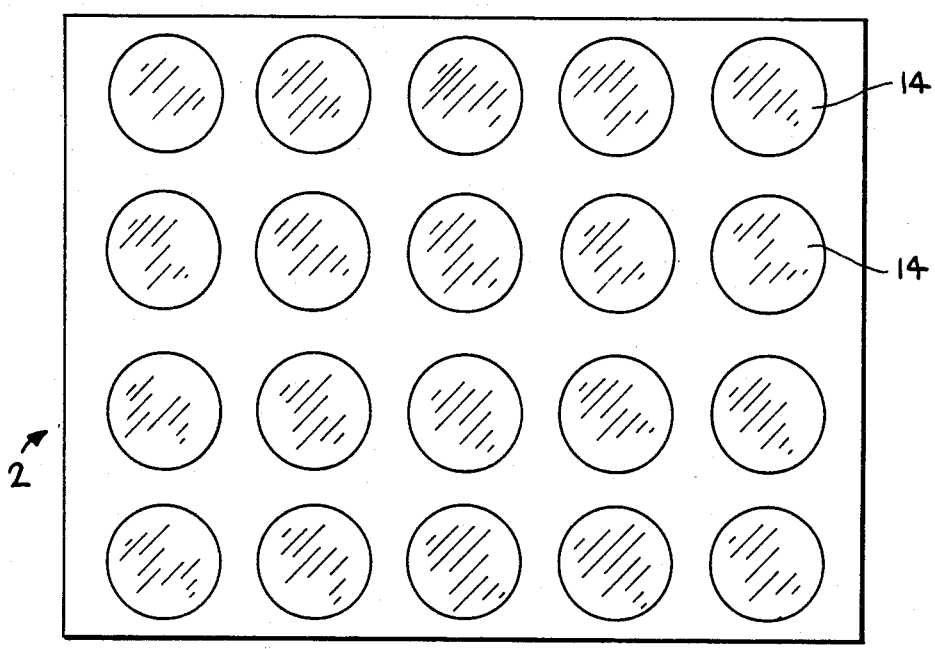
FIG. 8 is a top view of the lead arrangement of one embodiment of the invention.
Figure 9:
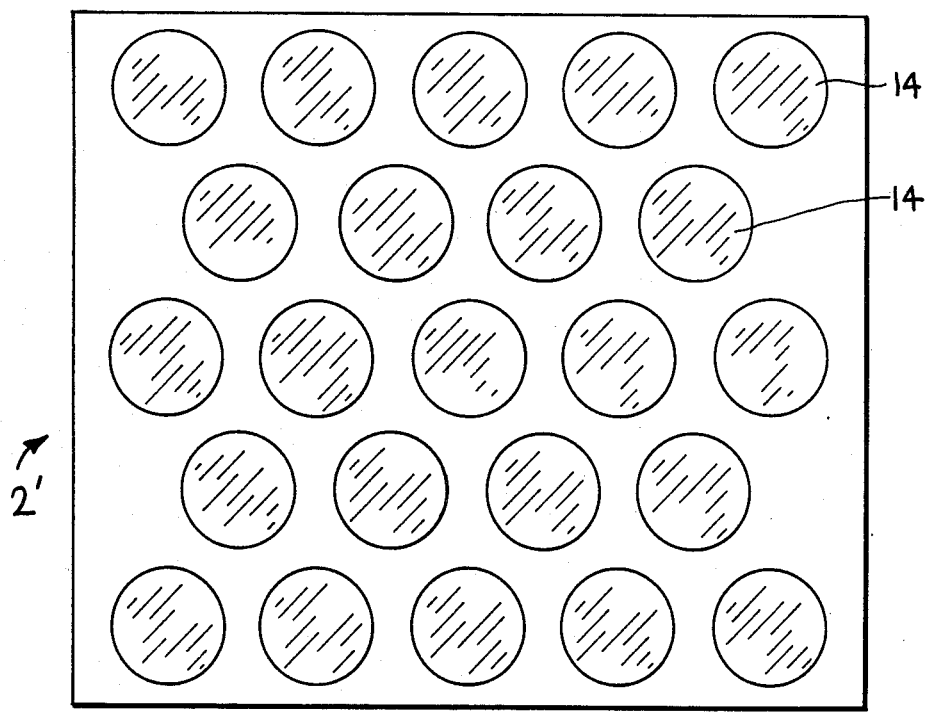
FIG. 9 is a top view of the lead arrangement of another embodiment of the invention.

Referring now to FIGS. 8 and 9, package 2 in FIG. 8 illustrates placement of the leads in an array wherein equally spaced apart rows or columns configure the leads into a square or "orthogonal" arrangement as previously discussed with respect to FIG. 1. While this arrangement of the leads will provide a lead density far in excess of that now used in standard packages wherein the leads are placed around two or four edges of the package, the arrangement of leads 14 in package 2' shown in FIG. 9 will provide yet an even higher density by placing the leads in a triangle or hexagonal spacing.

In the arrangement shown in FIG. 8, a 289 lead count surface mountable package with leads located on 25 mil centers would require 0.3 square inches. However, by placing the array of leads in a more densely packed hexagonal rather than orthogonal arrangement, in accordance with a preferred embodiment of the invention as shown in FIG. 9, the same number of leads can be placed in approximately 87% of the space used by the same orthogonal array. This number is approximately the sine of 60°. This smaller spacing permits a package of the same size to have 320 connections rather than 289 using orthogonal spacing.

The equivalent size for 320 leads in prior art chip carriers having a fine pitch of 25 mil spacing would require 4.6 square inches. Even a superfine (18 mil lead center) prior art package would still require 2.5 square inches in contrast with the 0.3 square inches of the invention. Thus, a 168 lead die, using the hexagonal spacing of FIG. 9, would be 330 mils square with the package being approximately 0.450 inches square. This would use approximately 0.2 square inches where a prior art pin grid array having the same number of leads would use 3.5 square inches.

The use of the preferred hexagonal spacing, in accordance with the invention, also improves the electrical characteristics of the package as well as increasing the number of leads which can be used in a given area for a given lead spacing. Using hexagonal spacing, the axes of the leads would be 120° apart on a plane. Since one could go in a negative as well as a positive direction, one has a choice of routing a signal from a single contact in six different directions set at 60° apart rather than four at 90°. This leads to calculating the worst case routing situation as one 30° away from two of the six directions. This leads the path to be $\sqrt{4/3}$ times longer than a direct path, compared to $\sqrt{2}$ times longer for the orthogonal system. Since system speed is determined by the worst case, the hexagonal system is 20% faster.

Thus, the invention provides an improved semiconductor package wherein the number of leads which may be attached to an integrated circuit die is radically increased without, however, increasing the overall size of the package by providing a preselected density of leads in an array of parallel and equally spaced apart leads which are then mounted directly to the die perpendicular to the plane of the die.

Having thus described the invention, what is claimed is:

1. A method for making a semiconductor device comprising an integrated circuit die and a mounting package including leads to interconnect the die with external electrical components, said process comprising:
   (a) forming an array of parallel conductor pins equidistantly spaced apart hexagonal to one another to provide enhanced spacing;
   (b) bonding the array of parallel conductor pins directly to an array of contact pads formed on an integrated circuit die in registry with said pin array while maintaining said die in a plane perpendicular to said parallel pins; and
   (c) surrounding said die with a package material capable of protecting said die.

2. The method of claim 1 wherein said array of parallel pins is formed by placing a plurality of equal length pins in a jig having a plurality of spaced apart parallel bores of equal depth in one surface thereof.

3. The method of claim 2 wherein the exposed ends of said pins are coated with solder and said die is then placed against said solder coated pins while heating said solder to cause said pins to be bonded perpendicular to said die.

4. The process of claim 3 wherein said die, having said pins bonded perpendicular thereto, is encapsulated in plastic to form a semiconductor device having a high density conductor pin array and further characterized by good electrical and thermal conductivity.

5. The method of claim 3 wherein said die, having said pins bonded perpendicular thereto, is sealed in a hermetically sealed case to protect said die from the external environment.

6. The method of claim 5 wherein said die having said pin array bonded thereto is placed in a mold having raised portions thereon contacting the surface of said die opposite the surface having said pin array bonded thereto, and having guide members on the side walls of said mold to center said die therein.

7. The method of claim 6 wherein an elastomeric material is placed in said mold around said die to provide shock mounting support for said die.

8. The method of claim 7 wherein an encapsulating material is placed in said mold over said die and elastomeric material to seal said die and elastomeric material in said mold.

9. The method of claim 2 wherein said pins in said die are partially encapsulated in a material capable of maintaining said pins in parallel alignment upon removal from said jig with both ends of each pin exposed for electrical contact thereto.

10. The method of claim 9 wherein said die is subsequently electrically bonded to said pins by coating one end of said pins with solder and then bringing said die into contact with said solder coated pins while heating said solder to cause said die to bond to said pins in a plane normal to the axes of said pins.

11. The method of claim 1 wherein said parallel pins are spaced 25 mils apart on center.

12. A method for making a semiconductor device comprising an integrated circuit die and a mounting package including leads to interconnect the die with external electrical components, said process comprising:

(a) forming an array of parallel conductor pins equidistantly spaced apart hexagonal to one another to provide enhanced spacing;

(b) forming one or more additional patterned layers of conductors adjacent one surface of a conventional integrated circuit die having contact points located on the periphery of said die to provide conductive paths from said peripheral conduction pads on said die to an array of contact pads on the outside surface of said one or more additional patterned layers in registry with said pin array;

(c) bonding said array of parallel conductor pins directly to said array of contact pads integrally formed on the outside surface of said die in registry with said pin array while maintaining said die in a plane perpendicular to said parallel pins; and (d) surrounding said die with a package material capable of protecting said die.

* * * * *